United States Patent
Knieriem et al.

(10) Patent No.: US 10,206,292 B2
(45) Date of Patent: Feb. 12, 2019

(54) BACKSHELL GUARD FOR AN AVIONICS UNIT

(71) Applicant: Gulfstream Aerospace Corporation, Savannah, GA (US)

(72) Inventors: Christopher Knieriem, Savannah, GA (US); Jonathan Edwards, Savannah, GA (US)

(73) Assignee: Gulfstream Aerospace Corporation, Savannah, GA (US)

( * ) Notice: Subject to any disclaimer, the term of this patent is extended or adjusted under 35 U.S.C. 154(b) by 143 days.

(21) Appl. No.: 15/152,417

(22) Filed: May 11, 2016

(65) Prior Publication Data

US 2017/0331216 A1     Nov. 16, 2017

(51) Int. Cl.
| | | |
|---|---|---|
| H01R 13/44 | (2006.01) | |
| H05K 5/00 | (2006.01) | |
| H01R 13/52 | (2006.01) | |
| H01R 13/447 | (2006.01) | |
| H01R 13/443 | (2006.01) | |

(52) U.S. Cl.
CPC .............. *H05K 5/00* (2013.01); *H01R 13/44* (2013.01); *H01R 13/443* (2013.01); *H01R 13/447* (2013.01); *H01R 13/5213* (2013.01)

(58) Field of Classification Search
CPC .... H01R 13/44; H01R 13/443; H01R 13/447; H01R 13/5213
USPC ....... 439/133, 134, 135, 148, 149, 519, 521, 439/892, 901
See application file for complete search history.

(56) References Cited

U.S. PATENT DOCUMENTS

| | | | | |
|---|---|---|---|---|
| 3,683,314 A * | 8/1972 | Elkins | ................. | H01R 13/639 174/138 F |
| 4,669,281 A * | 6/1987 | Young | ................. | E05B 73/0005 439/133 |
| 6,561,835 B1 * | 5/2003 | Hirschberg | ........ | H01R 13/6395 439/341 |
| 7,092,252 B2 * | 8/2006 | Robertson | ................. | G06F 1/20 257/E23.099 |
| 7,255,577 B2 * | 8/2007 | Graham | ............... | H01R 13/629 439/76.1 |
| 8,529,275 B2 * | 9/2013 | Kagotani | ........... | H01R 43/0256 439/41 |
| 8,909,839 B2 * | 12/2014 | Petrick | .................. | G06F 1/1626 361/724 |
| 2004/0009688 A1 * | 1/2004 | Mastoris | .............. | H01R 13/518 439/135 |
| 2008/0127461 A1 * | 6/2008 | Linden | ...................... | A45F 5/02 24/302 |
| 2012/0190222 A1 * | 7/2012 | Sun | ...................... | H01R 13/443 439/135 |

(Continued)

FOREIGN PATENT DOCUMENTS

GB          2240669 A *  8/1991    ........... H01R 13/447

*Primary Examiner* — Tho D Ta
(74) *Attorney, Agent, or Firm* — LKGlobal | Lorenz & Kopf, LLP

(57) ABSTRACT

A guard for a backshell of an aircraft avionics unit is disclosed herein. The guard includes a guard body having a first feature formed therein to slidably receive a first portion of the backshell, a second feature formed therein to slidably receive a second portion of the backshell and a third feature formed therein to protectively cover a mating connector area when the backshell has been slid into the guard body.

20 Claims, 11 Drawing Sheets

(56) References Cited

U.S. PATENT DOCUMENTS

2016/0087367 A1\* 3/2016 Yi ..................... H01R 13/447
439/135

\* cited by examiner

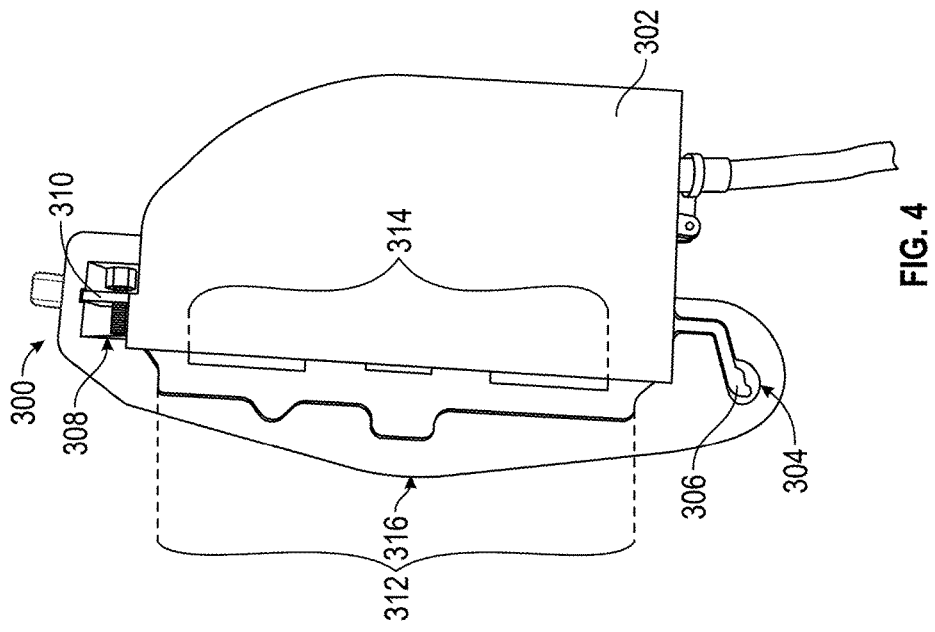
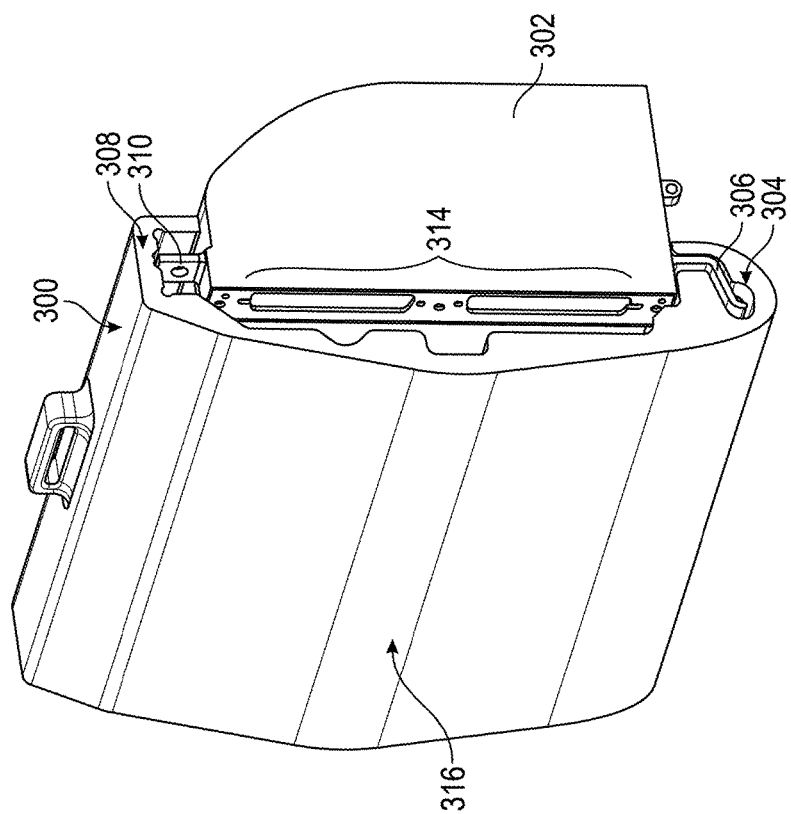

BACKSHELL GUARD FOR AN AVIONICS UNIT

TECHNICAL FIELD

The present invention generally relates to avionics units for aircraft, and more particularly relates to a guard for backshell connectors to an aircraft avionics unit.

BACKGROUND

Contemporary business aircraft require sophisticated avionics units to support safe air transportation. Generally, an avionics unit includes several circuit cards mounted into a chassis. Each of the circuit cards are coupled to various systems or subsystems of an aircraft by a backshell connector and cabling. Typically, an aircraft avionics unit is double or triple redundant for at least some of the circuit cards in the event of an avionics circuit card failure during flight.

When an aircraft avionics unit requires removal for servicing, or reinstallation following service, each of the multiple backshells must be held or positioned so as not to impede the removal or installation of the avionics unit. Typically, this requires several service technicians each of whom must be grounded by a ground strap to avoid electrostatic damage to the avionics unit. As will be appreciated, this process is time-consuming and expensive given that it requires multiple service technicians during the avionics unit removal or installation process. Moreover, given the number of backshells that must be held or positioned away from the avionics unit, there is a risk of damage to both the backshells and the avionics unit should one or more of the backshells come into contact with the avionics unit or other objects.

Accordingly, it is desirable to provide a guard for a backshell of an aircraft avionics unit. It is further desirable that the guard both protect the backshells and facilitate their positioning in a way so as not to impede removal or installation of an aircraft avionics unit. Furthermore, other desirable features and characteristics will become apparent from the subsequent detailed description and the appended claims, taken in conjunction with the accompanying drawings and the foregoing technical field and background.

BRIEF SUMMARY

Exemplary embodiments of a guard for a backshell connector of an aircraft avionics unit are disclosed herein.

In a first non-limiting embodiment, a guard for a backshell of an aircraft avionics unit includes a guard body having a first feature formed therein to slidably receive a first portion of the backshell, a second feature formed therein to slidably receive a second portion of the backshell and a third feature formed therein to protectively cover a mating connector area when the backshell has been slid into the guard body.

In a second non-limiting embodiment, a non-transitory computer-readable medium for producing a backshell guard comprises instructions that when executed by a processor cause a three-dimensional printer to successively deposit an electrostatic discharge resistant material to produce a backshell guard having a first feature formed therein to slidably receive a first portion of the backshell, a second feature formed therein to slidably receive a second portion of the backshell and a third feature formed therein to protectively cover the mating connector when the backshell has been slid into the guard body.

BRIEF DESCRIPTION OF THE DRAWINGS

The present invention will hereinafter be described in conjunction with the following drawing figures, wherein like numerals denote like elements.

FIG. 3 is a side perspective view illustrating a non-limiting embodiment of a backshell guard in accordance with the teachings of the present disclosure;

FIG. 4 is a side view illustrating a non-limiting embodiment of a backshell guard in accordance with the teachings of the present disclosure;

DETAILED DESCRIPTION

As used herein, the word "exemplary" means "serving as an example, instance, or illustration." The following detailed description is merely exemplary in nature and is not intended to limit application and uses. Any embodiment described herein as "exemplary" is not necessarily to be construed as preferred or advantageous over other embodiments. All of the embodiments described in this Detailed Description are exemplary embodiments provided to enable persons skilled in the art to make or use the embodiment and not to limit the scope that is defined by the claims. Furthermore, there is no intention to be bound by any expressed or implied theory presented in the preceding Technical Field, Background, Drawings Summary or the following Detailed Description.

A guard for the backshells of an aircraft avionics unit is disclosed herein. Without the inventive guard of the present disclosure, each individual backshell must be held or positioned so as not to impede the removal or installation of the avionics unit. Typically, this requires several service technicians, which is time-consuming and expensive. Additionally, care must be taken to prevent the backshells from damaging the avionics unit or have the mating connectors of the backshells damaged. A greater understanding of the backshell guard described above may be obtained through a review of the illustrations accompanying this application together with a review of the detailed description that follows.

Figure 1:
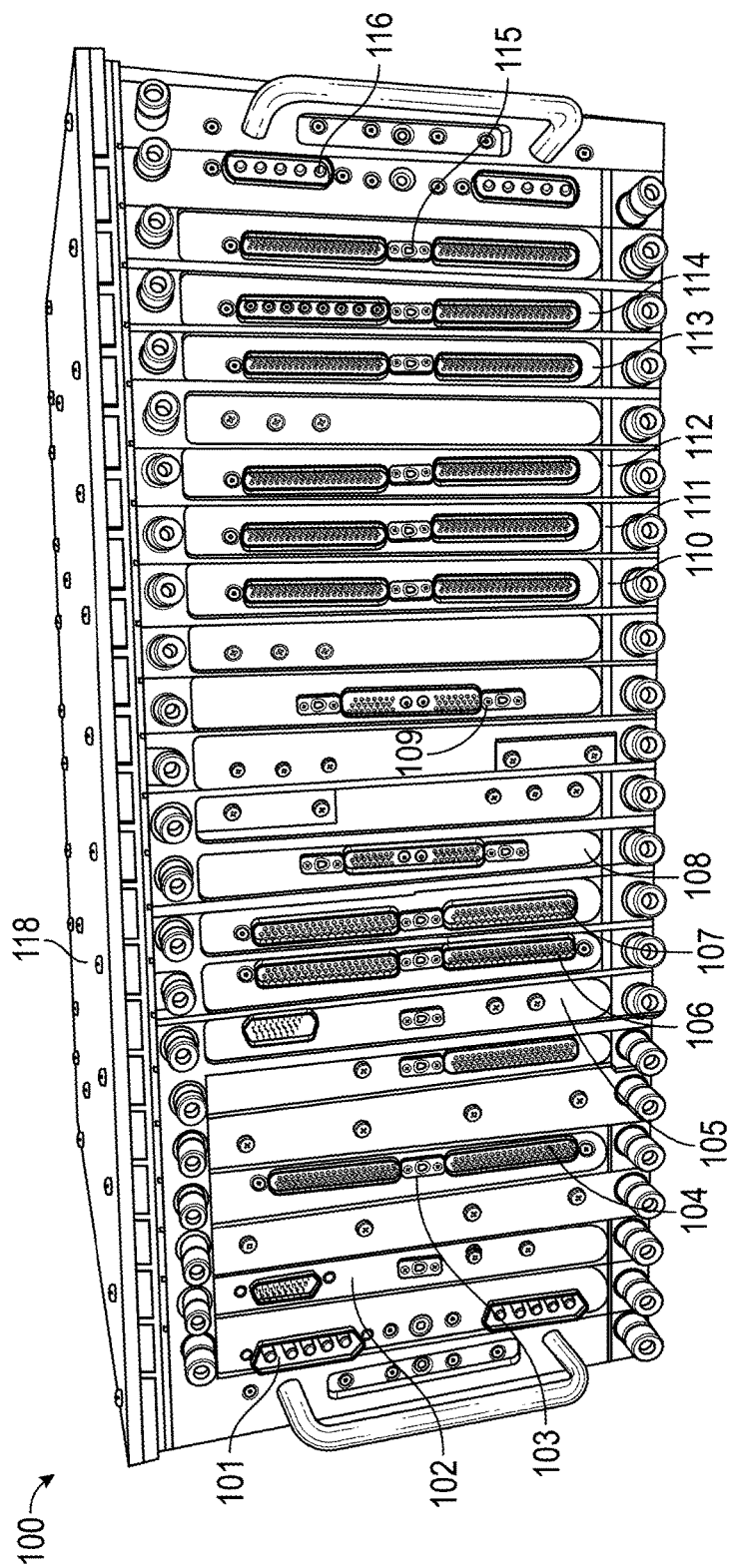
FIG. 1 is a perspective view illustrating a non-limiting embodiment of the aircraft avionics unit in accordance with the teachings of the present disclosure.

FIG. 1 is one exemplary illustration of a contemporary modular avionics unit 100. The modular avionics unit 100 illustrated in FIG. 1 comprises a plurality of circuit cards (sixteen cards in this example) 101-116 mounted into a chassis 118. As can be seen in FIG. 1, each of the circuit cards 101-116 has one or more connectors to receive or output information to perform the plurality of functions of the modular avionics unit. As will be appreciated, more or fewer circuit cards may be used in any particular implementation of the modular avionics unit 100.

Figure 2:
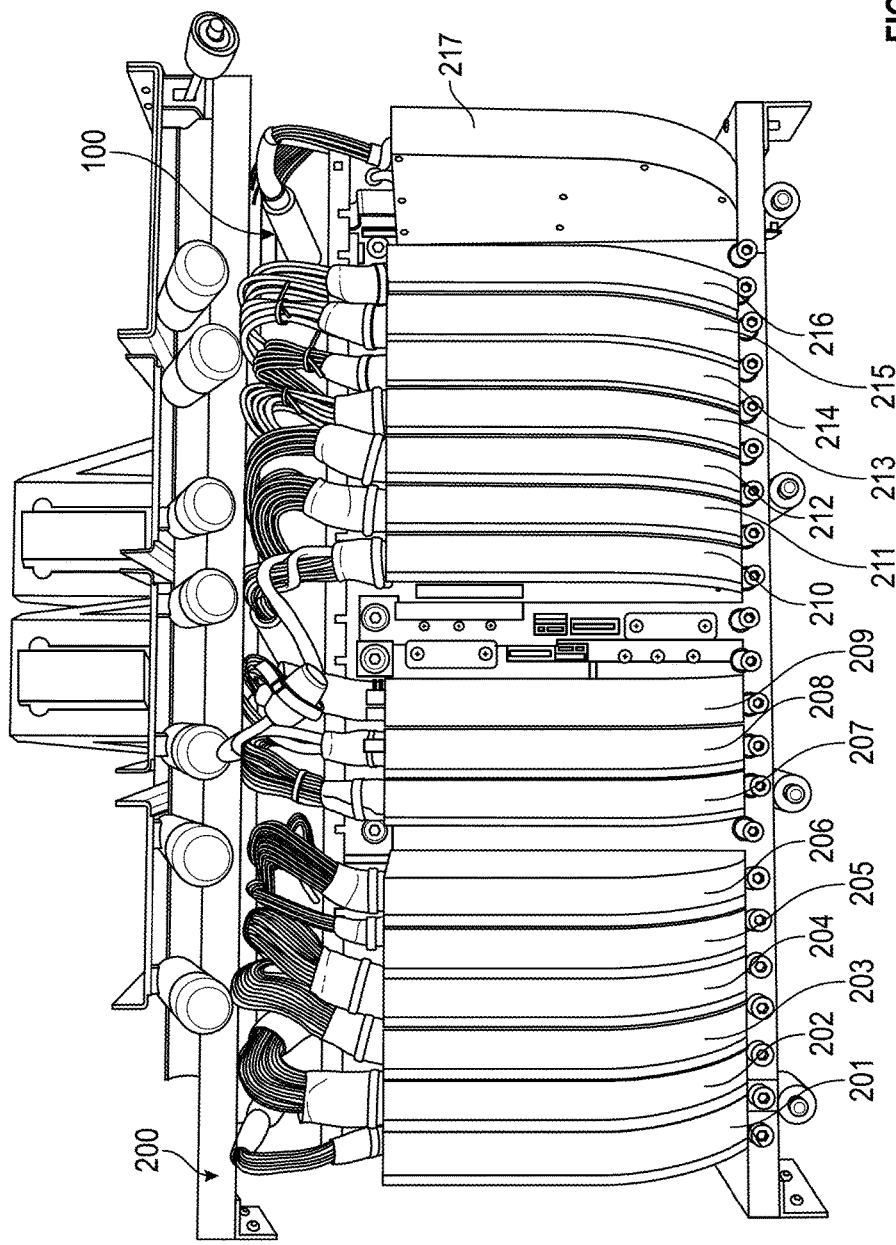
FIG. 2 is a perspective view illustrating a non-limiting embodiment showing the aircraft avionics unit of FIG. 1 coupled to the backshells in accordance with the teachings of the present disclosure.

Referring now to FIG. 2, the chassis 118 of another exemplary modular avionics unit (this example having seventeen circuit cards) is configured to be mounted in an equipment rack 200 onboard an aircraft. Once the modular avionics unit 100 is positioned within the equipment rack 200, a respective backshell 201-217 having a mating connector is coupled to each respective circuit card 101-117. As will be appreciated by viewing FIG. 2, each of the backshells 201-217 are traditionally held aloft and above the modular avionics units 100 in this embodiment in order to facilitate installation or removal of the modular avionics unit from the equipment rack 200. Given the number of backshells needed to couple to the modular avionics unit 100, installation or removal of the modular avionics unit 100 requires multiple service technicians in order to install or remove the modular avionics unit 100 without damage to the backshells 201-217 or the modular avionics unit 100.

Referring now to FIG. 3 and FIG. 4, a backshell guard 300 according to a non-limiting embodiment of the present disclosure is illustrated. FIG. 3 is a perspective view of the backshell guard 300 while FIG. 4 illustrates a side view. As can be seen, an exemplary backshell 302 is positioned within and protected by the guard 300. According to exemplary embodiments, the backshell guard 300 receives the backshell 302 by means of one or more features formed within the backshell guard 300. As used herein, a "feature" means a shape, facet, attribute or characteristic formed in the backshell guard 300. In some embodiments, the features are formed by a three-dimensional printer by depositing successive layers of material as is known in the art. In other embodiments, the features can be formed in the backshell guard 300 by milling away material. Still other embodiments may form various features in the backshell guard 300 using a conventional injection molding process. As will be appreciated, any combination of the foregoing techniques, or other techniques, may be used to form the features in the backshell guard 300. However the features are formed in the backshell guard 300, the features are used to receive and securely hold one or more backshells 302 to protect the backshells from damage and to prevent the backshells from damaging the modular avionics unit (100 of FIG. 1). In addition to physical security, the present disclosure contemplates that the backshell guard 300 will protect the backshells from electrostatic damage as well. Accordingly, in some embodiments, the backshell guard 300 comprises an electrostatic discharge resistant material. As used herein, "electrostatic discharge" means a sudden flow of electricity between two electrically charged objects caused by contact, an electrical short or dielectric breakdown. As will be appreciated, various materials are known to resist electrostatic discharge. As a non-limiting example, the present disclosure contemplates that an antistatic plastic may be used to form the backshell guard 300. As used herein, "antistatic" is intended to refer generally to any material which inhibits triboelectric charging.

Figure 5:
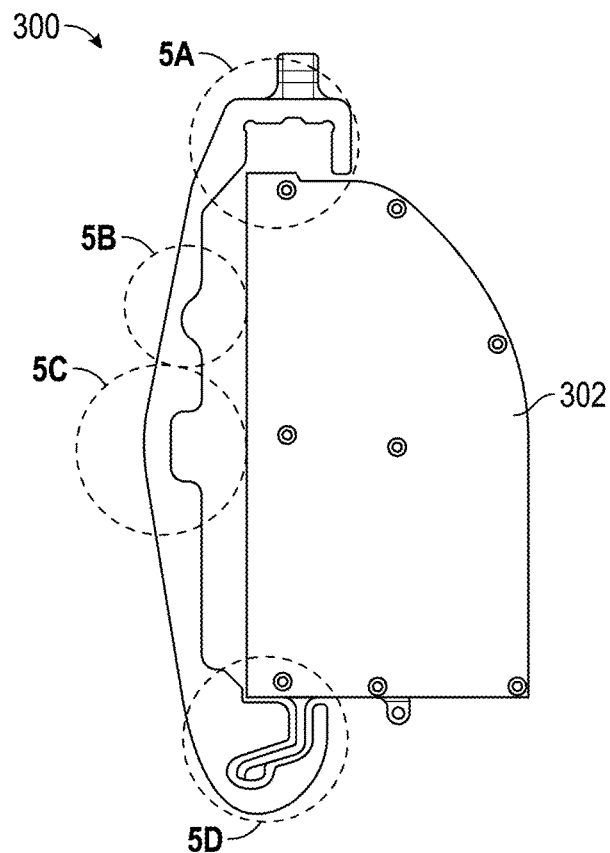
FIG. 5 is the side view of FIG. 4 with FIGS. 5A-5D illustrating non-limiting embodiments of features in a backshell guard in accordance with the teachings of the present disclosure.
Figure 5A:
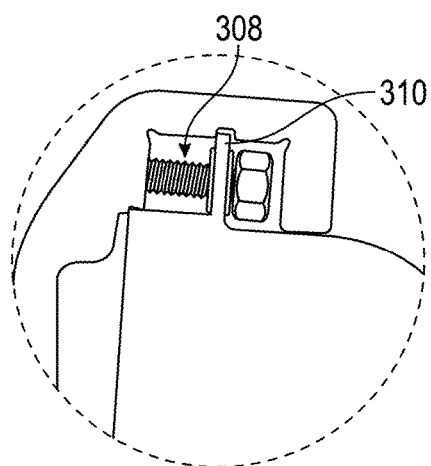
Figure 5B:
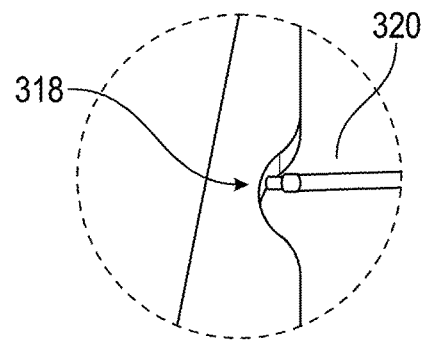
Figure 5C:
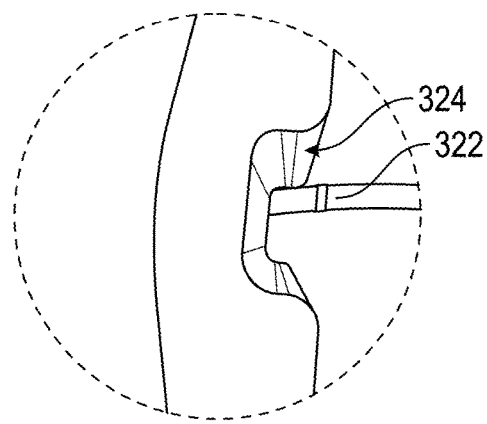
Figure 5D:
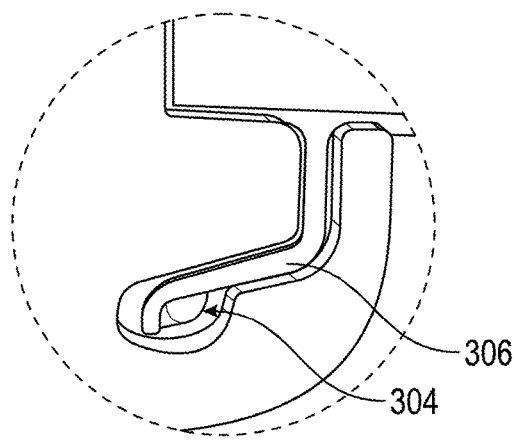

With continued reference to FIG. 3 and FIG. 4, the backshell guard 300 is illustrated having a first feature 304 that receives a first portion 306 of the backshell 302. Additionally, the backshell guard 300 has a second feature 308 that receives a second portion 310 of the backshell 302. Depending upon the design configuration of the backshell 302, the portion of the backshell 302 received by the features of the backshell guard 300 could be an edge, tab, slot, mounting hardware or alignment features. In this regard, the features of the backshell guard 300 could take any suitable corresponding or opposite shape to receive the backshell portions including, but not limited to, a slot, groove, trench, tab, ridge, arc, fastener, edge, alignment pin, flange, protrusion or corner. In the non-limiting embodiment illustrated in FIG. 3 and FIG. 4, the first feature 304 receives an alignment tab 306 of the backshell guard 302. Additionally, the second feature 308 receives a mechanical fastening portion 310 of the backshell 302. The first feature 304 and second feature 308 are configured within the backshell guard 300 to slidably receive one or more backshells 302. In some embodiments, the first feature 304 and second feature 308 extend throughout the length of the backshell guard 300 enabling backshells 302 to be slidably inserted from either end of the backshell guard 300. In other embodiments, the first feature 304 and second feature 308 of the backshell guard 300 do not extend through the entire length of the backshell guard 300, which operates to prevent the backshell guard 300 from inadvertently sliding out of the opposing end of the backshell guard 300. As mentioned above, each backshell 302 include a mating connector area 314 that has one or more mating connectors to connect to the connectors of the circuit cards 101-117 (see FIG. 1). Accordingly, the backshell guard 300 has a third feature 312 that has a width sufficient to shield the mating connector area 314 to protect the connectors from physical damage as well as electrostatic discharge damage. As will be appreciated by those skilled in the art, the backshell guard 300 may include any number of features to support or accommodate various portions or protrusions of the backshell 302 as shown in FIG. 5 and FIGS. 5A-5D. FIG. 5A provides an illustration detail view of the second feature 308 receiving the second portion 310 of the backshell 302, while FIG. 5d provides an illustration detail view of the first feature 304 receiving the first portion 306 of the backshell 302. Additionally, FIG. 5B provides an illustration detail view of the fourth feature 318 receiving the protrusion 320 of the backshell 302 and FIG. 5C provides an illustration detail view of the fifth feature 322 receiving the protrusion 324 of the backshell 302.

Figure 6:
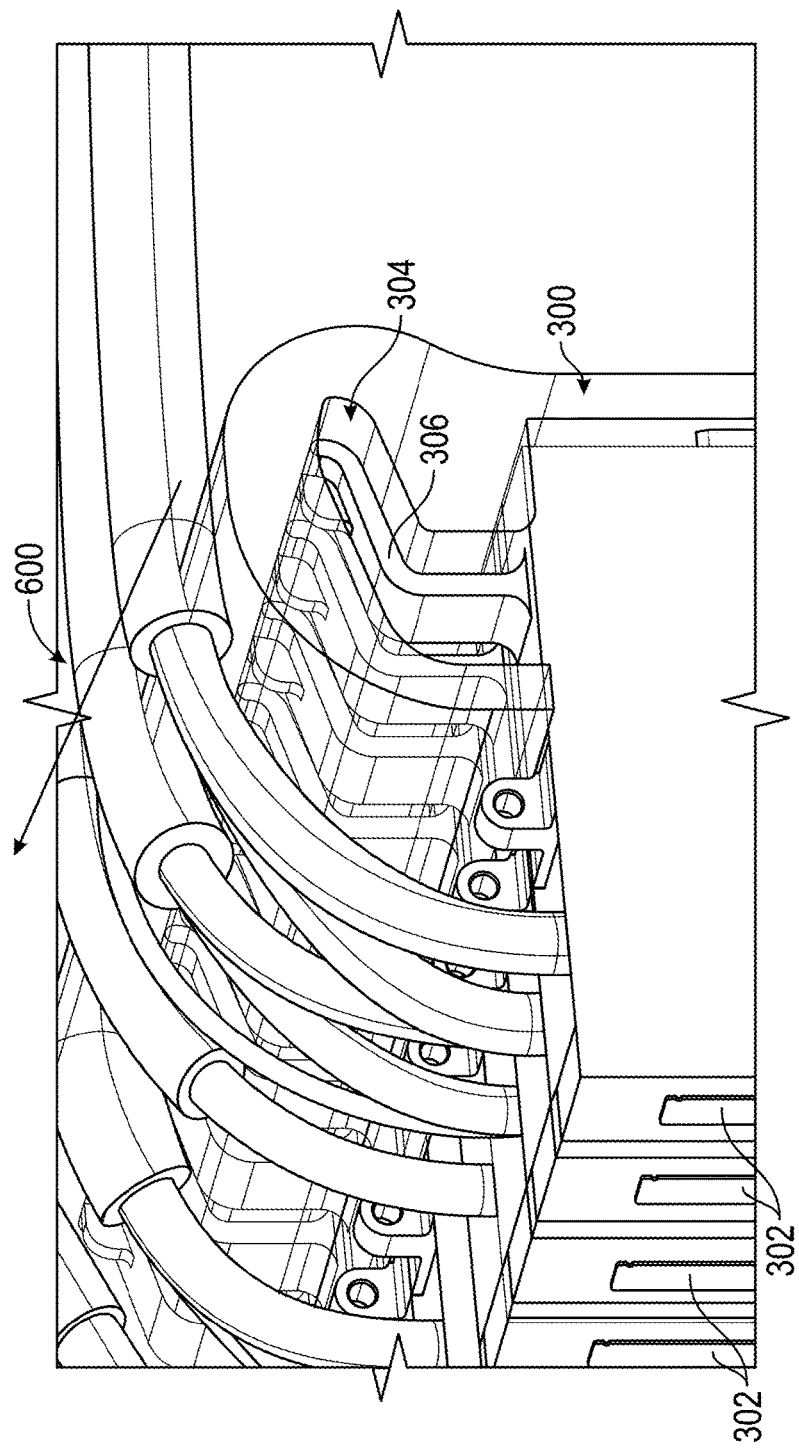
FIG. 6 is a side perspective transparent view illustrating a non-limiting embodiment of multiple backshells positioned within the backshell guard in accordance with the teachings of the present disclosure.
Figure 7:
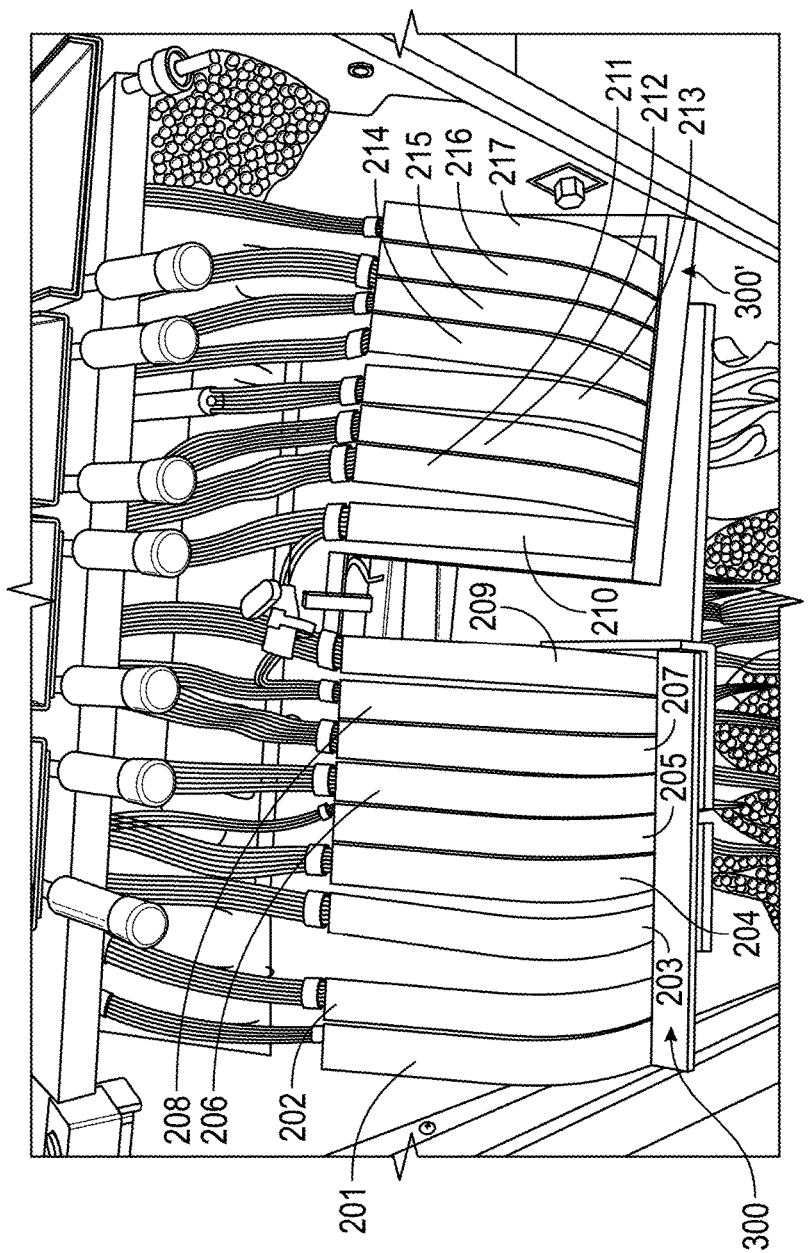
FIG. 7 is a perspective view illustrating a non-limiting embodiment of multiple backshells positioned within the backshell guard in accordance with the teachings of the present disclosure.

According to various non-limiting embodiments, the backshell guard 300 may have any particular length, width or shape as may be desired for any particular implementation. For example, the backshell guard 300 may have a length to slidably receive one or any number of backshells 302 as illustrated by the arrow 600 in FIG. 6. Additionally, the overall shape of the backshell guard 300 may have a shape desired to reduce the amount of material needed to form the backshell guard 300, reduce weight or facilitate positioning or securing the backshell guard 300. For example, as can be seen in FIG. 3 and FIG. 4, the backshell guard 300 has a surface 316 formed an arcuate shape. This provides an advantage of reducing the amount of material needed to produce the backshell guard 300 as well as reduce its weight.

Figure 8:
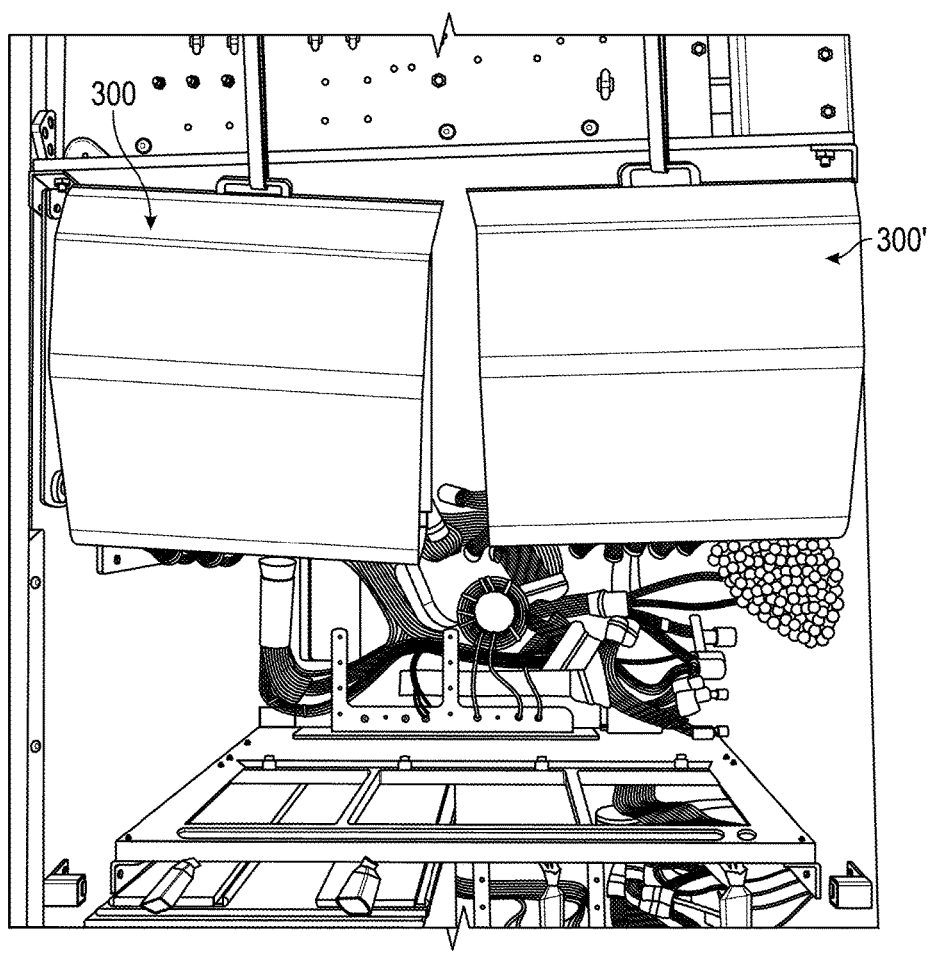
FIG. 8 is a perspective view illustrating a non-limiting embodiment of the backshell guard of FIG. 7 positioned to facilitate removal or installation of the avionics unit of FIG. 1 in accordance with the teachings of the present disclosure.

With continued reference to FIG. 1 through FIG. 6, FIG. 7 illustrates the backshells 201-217 positioned in two backshell guards 300 and 300'. That is, in the exemplary embodiment illustrated in FIG. 6 the backshell guard 300 and 300' have been designed to have a length sufficient to accommodate approximately nine backshells. Once the backshells 201-217 have been positioned within, and are protected by, the backshell guards 300 and 300' they can be easily and safely positioned to accommodate installation or removal of the modular avionics unit (100 of FIG. 1) as illustrated in FIG. 8. Thus, as will be appreciated, by employing the backshell guard 300 of the present disclosure a single technician can easily and safely position any number of backshells into a backshell guard and position the backshells such that the modular avionics unit can be easily removed or installed without risk of damage to either the modular avionics unit or the backshells. In this way servicing costs are reduced and equipment rework is minimized as the risk of damage has been greatly reduced by the backshell guard 300.

Figure 9A:
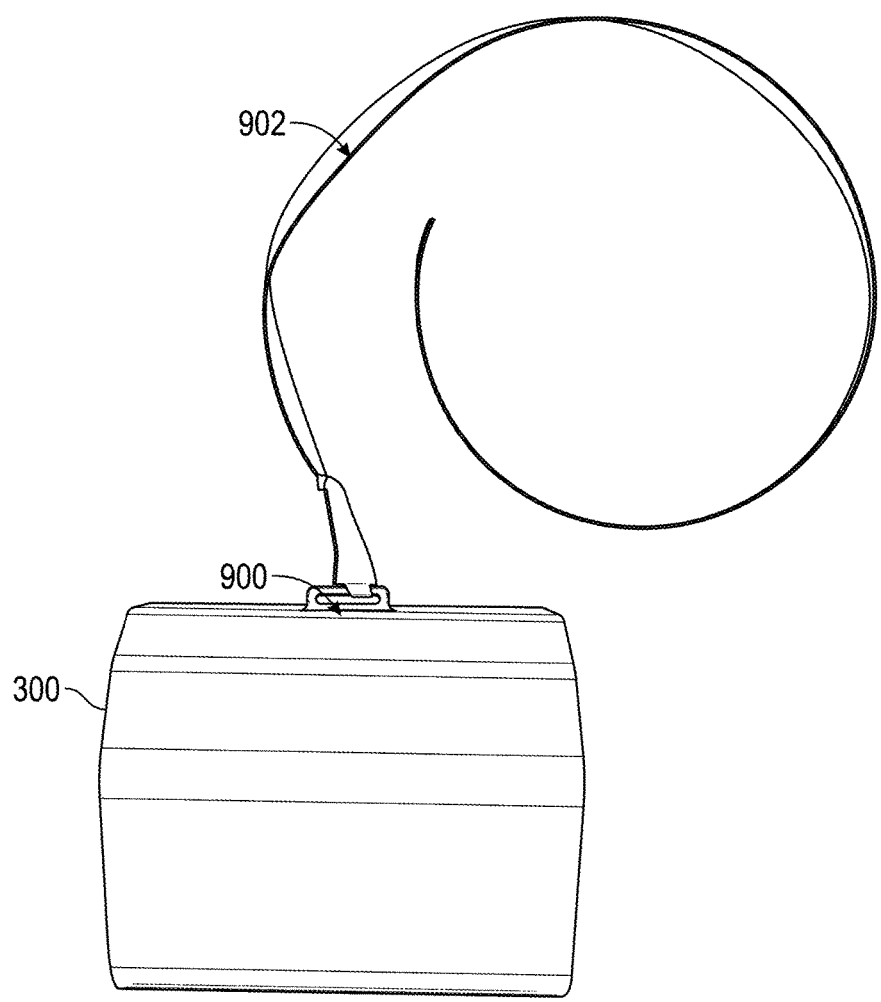
FIGS. 9A-9C are plan views illustrating non-limiting embodiments of a support strap feature for the backshell guard in accordance with the teachings of the present disclosure.
Figure 9B:
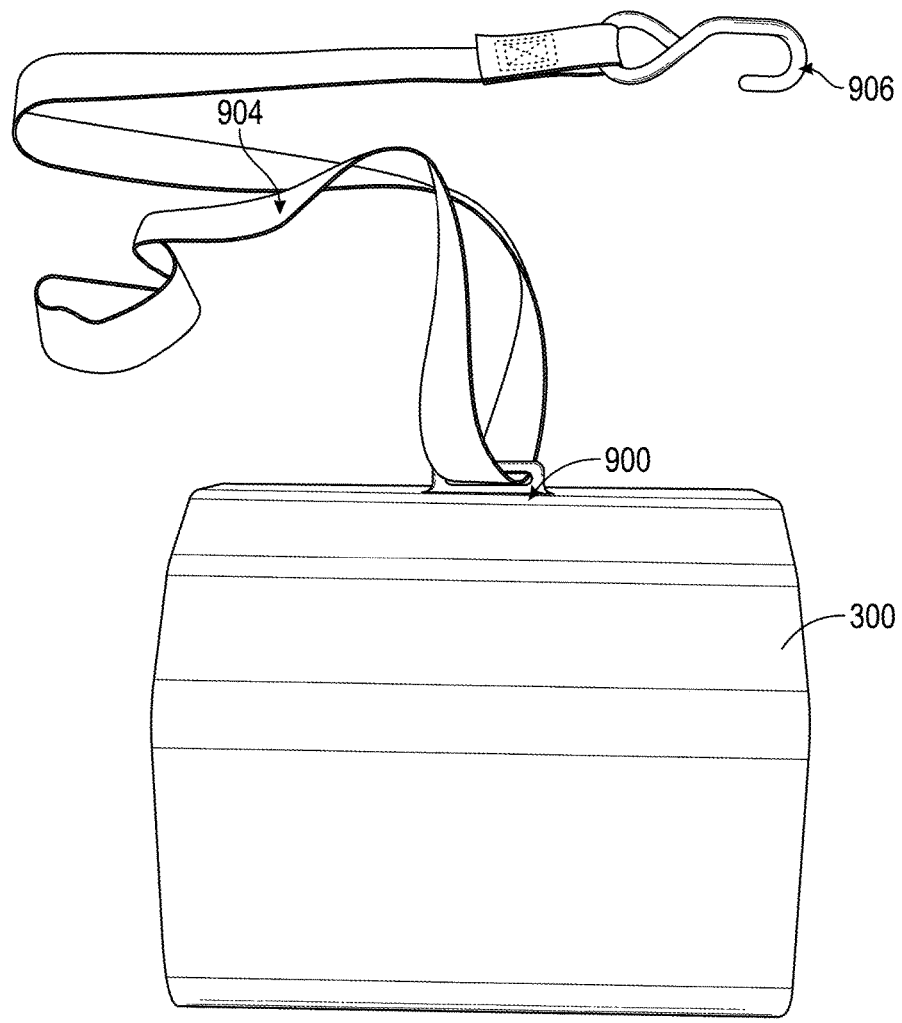
Figure 9C:
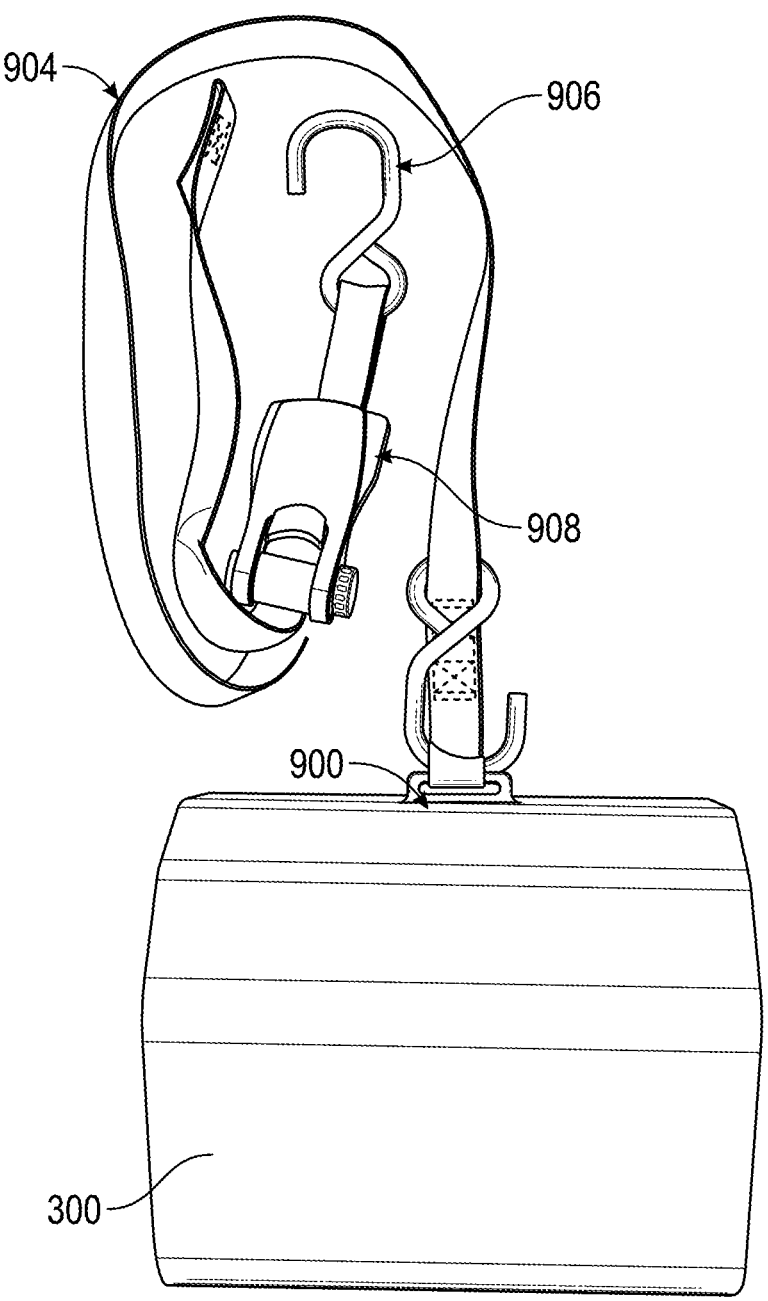

Referring now to FIGS. 9A-9C the backshell guard 300 can be seen from the side of its arcuate surface 316 and includes a support feature 900 that receives a support strap 902 which may be used to position the backshells and backshell guard is illustrated in FIG. 8. In some embodiments, the support strap 902 may be a simple cord, strap or lanyard (as illustrated in FIG. 9A) that can be tied to a supporting structure to hold the backshell guard 300 (and thus the backshells within the backshell guard) in position to remove or install the modular avionics unit. In FIG. 9B, a woven belt 904 is illustrated having a hook 906 for securing the backshell guard 300 to a supporting structure. In some embodiments, the woven belt 904 includes an adjustment feature 908 that allows the length of the support strap 904 to be set to any convenient length for supporting the backshell guard 300.

As mentioned above, the present disclosure contemplates that the backshell guard 300 may be formed by three-dimensional printing. Accordingly, the present disclosure contemplates a non-transitory computer-readable medium that would contain instructions that when executed by a processor would cause a three-dimensional printer to successfully deposit material in a way to form any number of features in the backshell guard 300 as required to receive any particular design of backshell. As a non-limiting example, in the embodiments illustrated in the present disclosure, the non-transitory computer-readable medium would contain instructions that when executed by a processor cause the three-dimensional printer to successfully deposit an electrostatic discharge resistant material to produce the first feature 304 to receive a first portion 306 of the backshell, the second feature 308 to receive the second portion 310 of the backshell and a third feature 312 to protect mating connector areas 314 of the backshells.

It will be appreciated that skilled artisans may implement the described functionality of a backshell guard in varying ways for each particular application, but such implementation decisions should not be interpreted as causing a departure from the scope as set forth in the claims.

In this document, relational terms such as first and second, and the like may be used solely to distinguish one entity or action from another entity or action without necessarily requiring or implying any actual such relationship or order between such entities or actions. Numerical ordinals such as first, second, third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as connect or coupled to that are used in describing a relationship between different elements does not imply that a direct physical connection must be made between these elements. For example, two elements may be connected to each other physically, electronically, logically, or in any other manner, through one or more additional elements.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the disclosure as set forth in the appended claims.

What is claimed is:

1. A guard for a backshell, the backshell having a mating connector to a connector on a circuit card that is mounted in a chassis, the guard comprising:
    a guard body having:
        a first feature formed therein to slidably receive a first portion of the backshell when the backshell is not connected to the circuit card that is mounted in the chassis;
        a second feature formed therein to slidably receive a second portion of the backshell when the backshell is not connected to the circuit card that is mounted in the chassis; and
        a third feature formed therein to protectively cover the mating connector when the backshell is not connected to the circuit card that is mounted in the chassis and has been slid into the guard body.

2. The guard of claim 1, wherein the first portion of the backshell comprises an alignment tab.

3. The guard of claim 1, wherein the second portion of the backshell comprises a mechanical fastener.

4. The guard of claim 1, wherein the guard body has a length to receive multiple backshells when the multiple backshells are not connected to respective circuit cards that are mounted in the chassis.

5. The guard of claim 1, wherein the first feature comprises one of the following group of features to receive the first portion of the backshell: slot groove, trench, tab, ridge, arc, fastener, edge, alignment pin, flange, protrusion and corner.

6. The guard of claim 1, wherein the second feature comprises one of the following group of features to receive the second portion of the backshell: slot, groove, trench, tab, ridge, arc, fastener, edge, alignment pin, flange, protrusion and corner.

7. The guard of claim 1, wherein the backshell has a mating connector area in the third feature has a width to shield the mating connector area of the backshell when the backshell is not connected to the circuit card that is mounted in the chassis.

8. The guard of claim 1, wherein the guard body is formed of an electrostatic discharge resistant material.

9. The guard of claim 8, wherein the electrostatic discharge resistant material comprises an antistatic material.

10. The guard of claim 1, further comprising a fourth feature to receive a support strap for the guard body.

11. The guard of claim 10, wherein the support strap has an adjustable length.

12. A guard for a backshell, the backshell having a mating connector to a connector on a circuit card that is mounted in a chassis, the guard comprising:
   a guard body formed of an electrostatic discharge resistant material having:
      a first feature formed therein to slidably receive an alignment tab of the backshell when the backshell is not connected to the circuit card that is mounted in the chassis;
      a second feature formed therein to slidably receive a mechanical fastener of the backshell when the backshell is not connected to the circuit card that is mounted in the chassis; and
      a third feature formed therein to protectively cover the mating connector when the backshell is not connected to the circuit card that is mounted in the chassis and has been slid into the guard body.

13. The guard of claim 12, wherein the electrostatic discharge resistant material comprises an antistatic material.

14. The guard of claim 12, wherein the guard body has a length to receive multiple backshells when the multiple backshells are not connected to respective circuit cards that are mounted in the chassis.

15. The guard of claim 12, wherein the first feature comprises one of the following group of features to receive the first portion of the backshell: slot groove, trench, tab, ridge, arc, fastener, edge, alignment pin, flange, protrusion and corner.

16. The guard of claim 12, wherein the second feature comprises one of the following group of features to receive the second portion of the backshell: slot groove, tab, trench, ridge, arc, fastener, edge, alignment pin, flange, protrusion and corner.

17. The guard of claim 12, wherein the backshell has a mating connector area in the third feature has a width to shield the mating connector area of the backshell when the backshell is not connected to the circuit card that is mounted in the chassis.

18. The guard of claim 12, further comprising a fourth feature to receive a support strap for the guard body.

19. The guard of claim 12, wherein the guard body has one surface thereof formed an arcuate shape.

20. A guard for a backshell, the backshell having a mating connector to a connector on a circuit card that is mounted in a chassis, the guard comprising:
   a guard body having:
      a first feature formed therein to slidably receive a first portion of the backshell when the backshell is not connected to the circuit card that is mounted in the chassis;
      a second feature formed therein to slidably receive a second portion of the backshell when the backshell is not connected to the circuit card that is mounted in the chassis; and
      a third feature formed therein and having an arcuate shape to protectively cover the mating connector when the backshell is not connected to the circuit card that is mounted in the chassis and has been slid into the guard body.

\* \* \* \* \*